United States Patent [19]

Riley

[11] 4,445,219
[45] Apr. 24, 1984

[54] LAYERED SEMICONDUCTOR LASER

[76] Inventor: Leon H. Riley, 7707 Logan Dr., Huntsville, Ala. 35802

[21] Appl. No.: 332,264

[22] Filed: Dec. 18, 1981

[51] Int. Cl.³ .............................................. H01S 3/19
[52] U.S. Cl. ........................................ 372/50; 357/17
[58] Field of Search ...................... 372/50, 44, 45, 46; 357/17

[56] References Cited

U.S. PATENT DOCUMENTS

| | | | |
|---|---|---|---|
| 3,514,715 | 6/1967 | Kosonocky | 331/94.5 |
| 4,045,749 | 8/1977 | Burnham et al. | 331/94.5 |
| 4,065,729 | 12/1977 | Gover et al. | 331/94.5 |
| 4,184,170 | 1/1980 | Burnham et al. | 331/94.5 |
| 4,233,090 | 11/1980 | Hawrylo et al. | 331/94.5 |

Primary Examiner—James W. Davie
Attorney, Agent, or Firm—Robert P. Gibson; Anthony T. Lane; James T. Deaton

[57] ABSTRACT

A layered semiconductor laser which has a multiplicity of thin film type layers of semiconductor diodes that are closely spaced such as to reduce phase differences between lasing layers or junctions in such a manner that the light emitting from all layers adds substantially in phase to provide a uniform phase front as the light leaves the layers of semiconductor material.

6 Claims, 2 Drawing Figures

LAYERED SEMICONDUCTOR LASER

DEDICATORY CLAUSE

The invention described herein may be manufactured, used, and licensed by or for the Government for governmental purposes without the payment to me of any royalties thereon.

CROSS REFERENCE TO RELATED APPLICATION

This application is related to applicant's co-pending application Ser. No. 332,263, filed Dec. 18, 1981 and now U.S. Pat. No. 4,400,256, issued Aug. 23, 1983. This application is related to applicant's co-pending application in that the co-pending application discloses a method by which a layered semiconductor laser can be made.

BACKGROUND OF THE INVENTION

Present semiconductor lasers have a thin lasing region. This thin region limits the output power and its beam divergence angle. The following formula relates laser diffraction-limited beam divergence angle to the output diameter of a lasing surface and its lasing wavelength.

$$\theta = 2.44 \lambda / d$$

Where
 $\theta$ = radians
 $\lambda$ = Wavelength (meters)
 d = diameter of lasing surface (meters)

For present semiconductor lasers $\theta$ becomes large as a result of d being extremely small.

An array of present semiconductor lasers can be formed, but the physical size of the lasers limit the diameter of the lasing area. The lasing area is inefficiently scattered over the array and does not provide for concentrated laser light emission or a small diffraction-limited beam divergence angle. Therefore, there is a need for closely spacing of semiconductor lasing functions so that lasing takes place coherently over a large number of semiconductor junctions in a homogeneous manner.

Therefore, it is an object of this invention to provide a layered semiconductor laser which provides a larger lasing area than presently available in semiconductor laser devices.

Another object of this invention is to provide a semiconductor laser device which has a smaller beam divergence angle than those of the present semiconductor laser devices.

Still another object of this invention is to provide a semiconductor laser device that has a larger lasing area and thereby provides a higher power output capability.

Still another object of this invention is to provide a layered semiconductor laser that has combination electrical and heat conductors that are intergal or internal to the lasing volume to provide increased laser efficiency by providing increased heat removal and low current loses.

Other objects and advantages of this invention will be obvious to those skilled in this art.

SUMMARY OF THE INVENTION

In accordance with this invention, a semiconductor diode laser device is provided that is made up of alternate layers of conductor, P type material, N type material, with this arrangement being repeated a multiplicity of times and with the layers being thin and closely spaced to reduce phase differences between lasing layers or junctions between the N type material and the P type material such that light emitting from all layers adds in phase to provide a uniform phase front as light leaves the layers of semiconductor material.

DESCRIPTION OF THE PREFERRED EMBODIMENT

Figure 1:
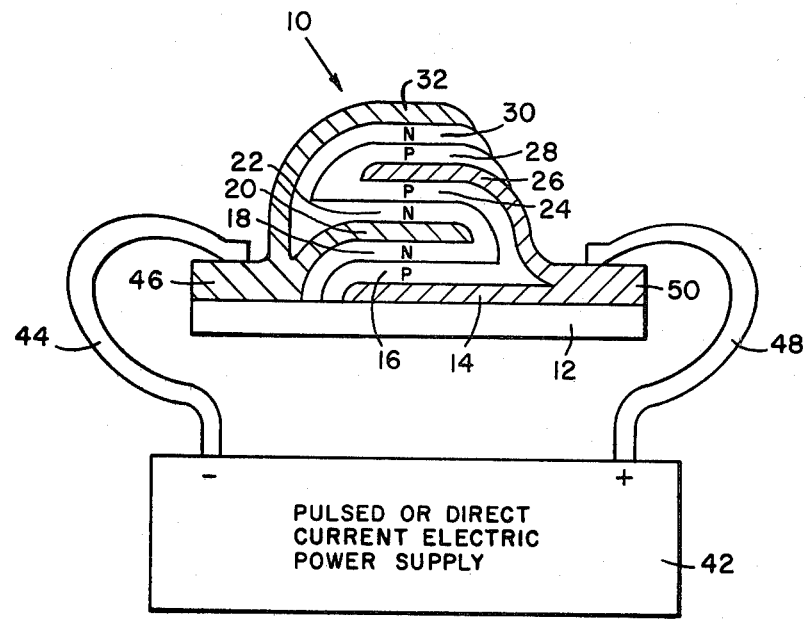
FIG. 1 is a sectional view of a layered semiconductor laser device in accordance with this invention.

Referring now to FIG. 1, semiconductor laser 10 includes an undoped semiconductor substrate 12 on which a first conductor 14 is mounted and such as by being deposited thereon. A first P type semiconductor 16 is mounted over a portion of conductor 14 and over P type semiconductor 16, an N type semiconductor 18 is mounted. Next an electrical lead 20 is mounted over N type conductor 18 and over a portion of substrate 12. Next, another layer of N type semiconductor material is mounted over electrical conductor 20 and made integral with lower N type semiconductor 18. Another P type semiconductor 24 is mounted over N type semiconductor 22 and is also made integral with P type semiconductor 16. Next, electrical lead 26 is mounted over P type semiconductor 24 and is made integral with first electrical conductor 14. Another layer of P type semiconductor material 28 is mounted over electrical lead 26 and made integral with P type semiconductor 24. Another N type semiconductor 30 is placed over P type semiconductor 28 and N type semiconductor 30 is made integral with N type semiconductor 22 and then additional electrical lead 32 is placed over N type semiconductor 30 and made integral with electrical lead 20. Three complete N-P type semiconductor junctions are shown; however as many junctions as needed can be stacked to provide the output needed. The criticality in stacking the layers as illustrated depends on the thinness of the layers of each semiconductor diode and electrical leads. The thickness of each semiconductor laser diode layer of the N type material or the P type material is normally less than one tenth of the lasing wavelength. However, in some instances the thickness may not be limited to one tenth of the lasing wavelength. That is, in some applications the thickness of each semiconductor laser diode layer can be slightly more than one tenth of the lasing wavelength. The close spacing of the N and P type semiconductor lasers reduces phase differences between lasing layers or junctions such that the light emitting from all layers adds in phase to provide a uniform phase front as the emitted light leaves the layers of semiconductor material. Any of the currently available semiconductor materials and dopants may be used in the fabrication of the N and P type semiconductor materials and a specific typical semiconductor material is gallium arsenide. A typical P type semiconductor material is zinc doped and a typical N type is tellurium doped. Light emission of this gallium arsenide material is at 0.84 micron. A one tenth wavelength of this material is 0.084 microns. The semiconductor material is made thin as discussed so that light is emitted throughout the semiconductor material. The sandwiched conductors are also made thin enough so that some light will pass through them and so that the physical gemometry of the laser is not seriously affected. It is also pointed out that a wide range of melting point metals as the electrical conductors can be used in the thin film layered semiconductor laser such as metals of silver, gold, aluminum, copper and tungsten. The specific metal of the electrical conductor that is to be used is chosen depending upon the particular application of the device.

Figure 2:
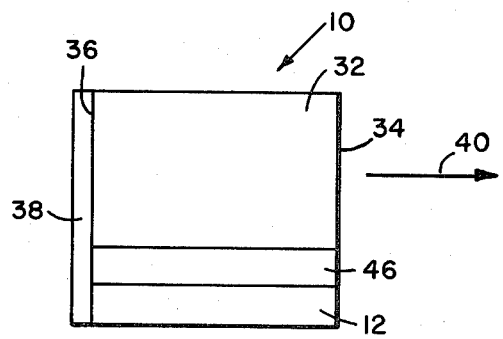
FIG. 2 is a side view of the layered semiconductor laser device in accordance with this invention.

Referring now to FIG. 2, laser 10 has ends 34 and 36 that are each cut and polished to provide smooth end surfaces. A dielectric mirror 38 of non-conductive dielectric reflecting material is secured in a conventional manner to end surface 36 so as to cause light to be reflected toward the opposite end 34 for being emitted as laser light 40 as schematically illustrated.

Referring now to FIG. 1, either a pulsed or direct current electrical power supply 42 is provided for layered semiconductor 10. Lead 44 which is connected from the negative side of the power supply to end 46 of leads 20 and 32 provides a negative power supply to each of the N type semiconductors as illustrated and power supply 42 also has a lead 48 that is connected to the remote end 50 of leads 14 and 26 to provide a positive power supply to each of the P type semiconductor layers as illustrated. By providing the electrical leads into the layered semiconductor device as illustrated, the electrical potential is applied very efficiently across each of the N and P type junctions to produce an especially efficient laser arrangement. This efficiency is appreciated in applicant's layered semiconductor laser by applicant's providing electrical conductors such that both heat is removed from the laser interior by the electrical leads and the electrical leads provide low loss current paths into the lasing area. The layered semiconductor laser as disclosed herein can be made by various methods such as by vapor deposition, sputtering, or other similar processes. Applicant's copending application Ser. No. 332,263 filed Dec. 18, 1981 discloses a specific sputtering method for making the efficient thin film layered semiconductor laser disclosed herein.

In operation, when a power supply is applied across leads 44 and 48 as illustrated to provide a negative bias at leads 20 and 32 and a positive bias at leads 14 and 26, the semiconductor laser material is caused to lase at each of the laser junctions such that the light emitting at 40 (see FIG. 2) from the plurality of junctions adds in phase to provide a uniform phase front as the light leaves the layers of semiconductor material.

As can be appreciated, the thin film layered semiconductor laser in accordance with this invention provides advantages over previously produced semiconductor lasers. For example, applicant's layered semiconductor laser device provides a larger lasing area than that of presently known semiconductor lasers, provides a smaller beam divergence angle than is possible with present semiconductor lasers, provides for higher power output than that of present semiconductor lasers by providing a larger lasing area, provides for efficient conducting of the electrical potential to the semiconductor layers and at the same time providing efficient heat conduction away from the semiconductor layers to thereby provide increased laser efficiency due to increased heat removable and low current losses, and by providing reduced $I^2R$ losses in the semiconductor material due to the semiconductor material being concentrated at the lasing areas.

I claim:

1. A layered semiconductor laser device comprising a semiconductor substrate material having a multiplicity of layers of N type and P type semiconductor material forming a multiplicity of laser junctions with electrical leads connected on opposite sides of each laser junction with the leads connected to the P type material being inner connected with each other for connecting to a positive source and the leads connected to the N type material being inner connected with each other for connection to a negative source, resonator means being provided by each layer of said junctions of N and P type materials and each of said junctions being of such close spacing relative to adjacent junctions as to reduce phase differences between lasing junctions such that light emitting from said junctions adds in phase to provide a uniform phase front as the emitted light leaves the junctions of semiconductor material.

2. A layered semiconductor laser device as set forth in claim 1, wherein said layers of N and P type semiconductor material have opposite ends that are smooth and polished with one of said surfaces having a non-conductive dielectric reflecting material mounted thereon and the other surface being adapted for emission of said light.

3. A layered semiconductor laser device as set forth in claim 2, wherein each of said N type semiconductor material layers is integral with each of the other N type semiconductor layers and wherein each of said P type semiconductor layers is integral with each of the other P type semiconductor layers.

4. A layered semiconductor laser device as set forth in claim 3, wherein said layers of semiconductor laser material each have a thickness which is less than one tenth of the lasing wavelength of the semiconductor lasing material.

5. A layered semiconductor laser device as set forth in claim 4, wherein said semiconductor laser material of the N and P type is gallium arsenide with said P type material being zinc doped and said N type being tellurium doped.

6. A layered semiconductor laser device as set forth in claim 5, wherein each electrical lead substantially covers one surface of one of the N or P type semiconductor materials for a single layer and said lead covering the length of said layer to provide efficient heat removal from the layers and to provide for low current loss from a source to the laser layers.

* * * * *